United States Patent
Fuchs

(10) Patent No.: US 12,372,487 B2
(45) Date of Patent: Jul. 29, 2025

(54) SENSOR DEVICE FOR MAGNETIC FIELD MEASUREMENT BY MEANS OF OPTICAL MAGNETIC RESONANCE MEASUREMENT

(71) Applicant: Robert Bosch GmbH, Stuttgart (DE)

(72) Inventor: Tino Fuchs, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 132 days.

(21) Appl. No.: 18/547,402

(22) PCT Filed: Mar. 25, 2022

(86) PCT No.: PCT/EP2022/057882
§ 371 (c)(1),
(2) Date: Aug. 22, 2023

(87) PCT Pub. No.: WO2022/207480
PCT Pub. Date: Oct. 6, 2022

(65) Prior Publication Data
US 2024/0142396 A1 May 2, 2024

(30) Foreign Application Priority Data
Mar. 29, 2021 (DE) .............. 10 2021 203 129.3

(51) Int. Cl.
*G01N 24/00* (2006.01)
*G01R 33/24* (2006.01)
(Continued)

(52) U.S. Cl.
CPC ........... *G01N 24/006* (2013.01); *G01R 33/24* (2013.01); *G01R 33/323* (2013.01); *G01R 33/381* (2013.01)

(58) Field of Classification Search
CPC .... G01N 24/006; G01R 33/24; G01R 33/323; G01R 33/381; G01R 33/26
See application file for complete search history.

(56) References Cited

FOREIGN PATENT DOCUMENTS

CN 108983121 A 12/2018
DE 10 2018 214 617 A1 3/2020
(Continued)

OTHER PUBLICATIONS

International Search Report corresponding to PCT Application No. PCT/EP2022/057882, mailed Jul. 6, 2022 (German and English language document) (7 pages).
(Continued)

*Primary Examiner* — Daniel R Miller
(74) *Attorney, Agent, or Firm* — Maginot, Moore & Beck LLP

(57) ABSTRACT

A sensor device for magnetic field measurement using optical magnetic resonance measurement (ODMR) includes a sensor device for magnetic field measurement using ODMR, including a diamond having a plurality of nitrogen defects, a laser emitter, a photodetector, and a circuit board. The laser emitter is designed for the fluorescence excitation of the nitrogen defects, and the photodetector is designed to receive fluorescence radiation of the nitrogen defects. The circuit board has a plurality of layers comprising at least one inner layer; the laser emitter is disposed on an upper face of the circuit board; the photodetector is disposed on a lower face of the circuit board; the diamond is disposed in the interior of the circuit board in the plane of extension of the at least one inner layer; and at least one of the layers has current-carrying structures designed to produce a homogeneous magnetic field which is oriented perpendicularly to the layers of the circuit board and which permeates the diamond.

11 Claims, 1 Drawing Sheet

(51) Int. Cl.
*G01R 33/32* (2006.01)
*G01R 33/381* (2006.01)

(56) References Cited

FOREIGN PATENT DOCUMENTS

| EP | 3644081 A1 | * | 4/2020 | ............ G01N 24/10 |
| WO | WO-2020057890 A1 | * | 3/2020 | ........... G01R 33/032 |
| WO | WO-2021230868 A1 | * | 11/2021 | |

OTHER PUBLICATIONS

Stürner et al., "Compact integrated magnetometer based on nitrogen-vacancy centres in diamond," Diamond and Related Materials, Jan. 17, 2019 (Jan. 17, 2019), pp. 59-65, vol. 93, XP085642093.
Zheng et al., "A hand-held magnetometer based on an ensemble of nitrogen-vacancy centers in diamond," Journal of Physics D; Applied Physics, Feb. 11, 2020 (Feb. 11, 2020), pp. 1-6, vol. 53, No. 15, XP020352447.
Chen et al., "Vectorial Near-Field Characterization of Microwave Device by Using Micro Diamond Based on Tapered Fiber," IEEE Journal of Quantum Electronics, IEEE, Jun. 2020, pp. 1-6, vol. 56. No. 3, XP011787316.
Stürner et al., "Integrated and Portable Magnetometer Based on Nitrogen-Vacancy Ensembles in Diamond," Advanced Quantum Technologies, Feb. 10, 2021 (Feb. 10, 2021), pp. 2000111 (1-11), vol. 4, No. 4, XP055936395.

\* cited by examiner

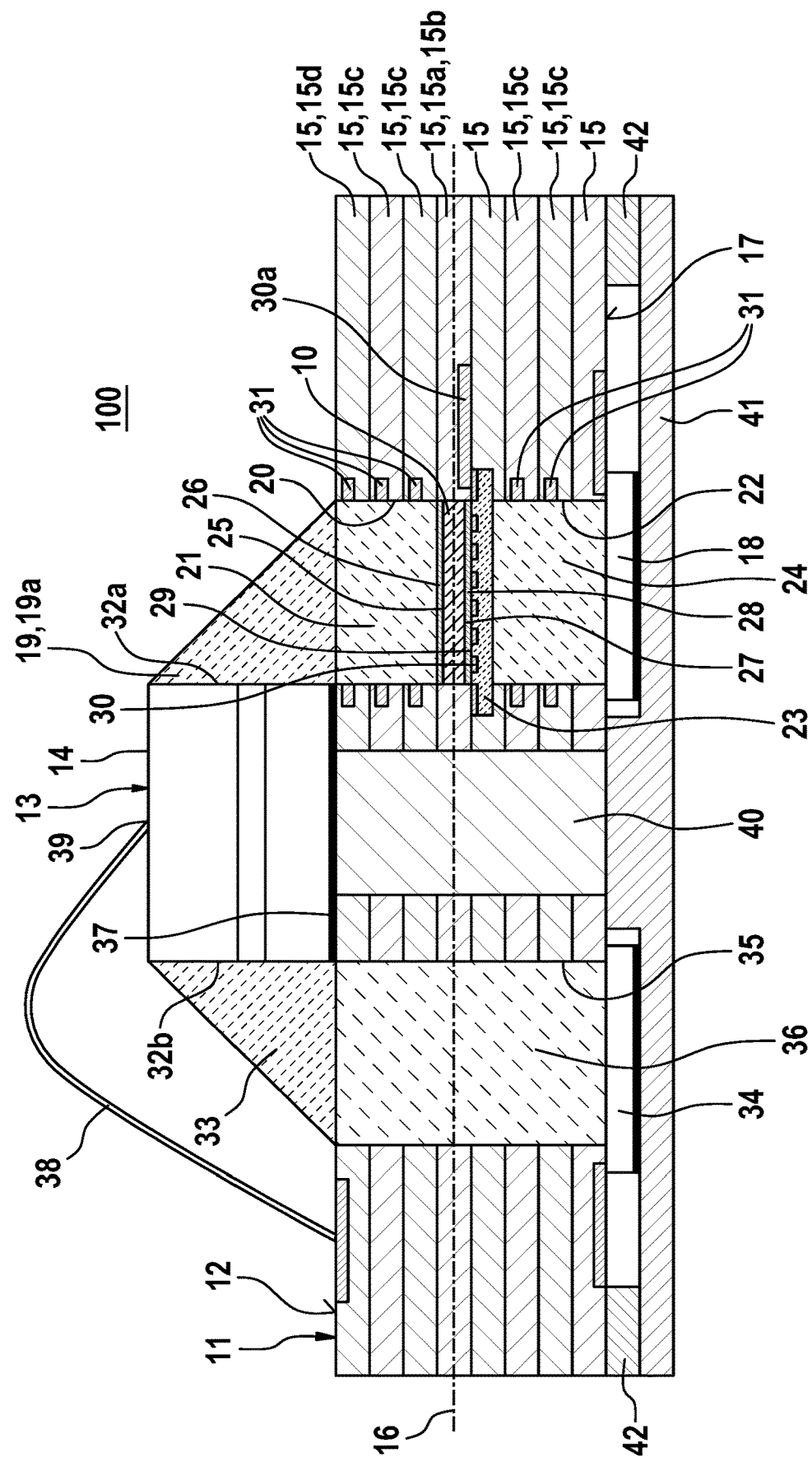

SENSOR DEVICE FOR MAGNETIC FIELD MEASUREMENT BY MEANS OF OPTICAL MAGNETIC RESONANCE MEASUREMENT

This application is a 35 U.S.C. § 371 National Stage Application of PCT/EP2022/057882, filed on Mar. 25, 2022, which claims the benefit of priority to Serial No. DE 10 2021 203 129.3, filed on Mar. 29, 2021 in Germany, the disclosures of which are incorporated herein by reference in their entirety.

The present disclosure relates to a sensor device for magnetic field measurement by means of optical magnetic resonance measurement (ODMR), comprising a diamond having a plurality of color centers, in particular nitrogen defects, a laser emitter, a first photodetector, and a circuit board, wherein the laser emitter is designed for fluorescence excitation of the color centers in the diamond, wherein the first photodetector is designed in order to receive fluorescence radiation of the color centers of the diamond.

BACKGROUND

Negatively charged nitrogen defect centers in a diamond, i.e., a color center consisting of a substituted nitrogen atom in the diamond grid and defects directly adjacent in the grid, can be utilized for highly sensitive measurements of magnetic fields, electrical fields, mechanical stresses, and temperatures. Such quantum technologies offer decisive advantages compared to classical sensor principles. The advantages include ultra-high sensibilities, the possibility of vector magnetometry (directional determination of the magnetic field), and a large linear measuring range (Zeeman effect). Furthermore, no degradation occurs, because color centers are stable or do not fade, and the measurement is based on quantum mechanical states. In order to read out a sensor based on nitrogen defect centers, the magnetic resonance of the triplet of the basic state is optically detected (ODMR—optically detected magnetic resonance). For this purpose, the nitrogen defect center must be excited with green light. The red-shifted fluorescent light shows a characteristic dip in the energetic position of the electron spin resonance. Due to the Zeeman effect, the layer is linearly dependent on the magnetic field at the location of the nitrogen defect center. Because the nitrogen defect center in the single-crystal diamond has four possible orientations in the crystal grid, the presence of a directed magnetic field causes the nitrogen defect centers present in the crystal to react with different strengths to the external magnetic field, depending on their orientation. That is to say, the projection of the magnetic field onto the nitrogen defect axis is different in size. In the maximum case, four pairs of fluorescence minima associated with one another can thus appear in the spectrum, from whose shape and position the amount and direction of the magnetic field can be clearly determined.

In order to be able to obtain vector information even in case of weak outer magnetic fields, suitable technical measures must ensure that the ODMR spectrum can also distinguish the contributions of all four possible nitrogen defect orientations in the diamond crystal without an external magnetic field acting on the sensor. This can be achieved by a static bias magnetic field provided within the sensor through appropriate technical measures. The bias magnetic field must have as homogeneous a field strength as possible within the sensitive diamond volume, as inhomogeneities of the bias magnetic field impair the sensitivity of the sensor. The strength of the bias magnetic field should be between 100 µT and 10 mT, ideally approximately 1 mT, for effective cleavage of the four nitrogen defect orientations. The bias field can deviate from the target value by not more than 1α in the range of the diamond volume. The production of the bias field can be achieved by permanent magnets or by current-perfused coils.

In order to be able to achieve a sensitivity of <1 pT/√Hz, it is necessary to optically pump the nitrogen defects in the diamond with approximately 1% of the saturation power density at 100 kW/cm$^2$. Laser emitters are used in order to achieve such intensities.

In the known sensor devices for magnetic field measurement by means of optical magnetic resonance measurement, this laser emitter is a stand-alone component, and the light is guided to the diamond either by free-beam optics or by an optical fiber. Known sensor devices for magnetic field measurement therefore require a large design space, thereby limiting the possible fields of application. In addition, the separate laser emitter makes a significant contribution to manufacturing costs, so that application cases with high cost-related pressure cannot be served.

DE 10 2018 214 617 A1 of the applicant discloses a sensor device with a crystal body, in particular a diamond, with a number of color centers, in particular nitrogen defects, a light source for irradiating the crystal body with visible light, a high-frequency device for irradiating the crystal body with microwaves, and a photodetector. The photodetector is adapted for detecting fluorescent light, which is produced due to the irradiation of the crystal body by the visible light and microwaves, wherein the sensor means comprises a gradient refractive index lens disposed between the crystal body and the photodetector or a light conductor disposed between the crystal body and the photodetector, and/or a mirror at least partially surrounding the visible light source and/or a filter layer covering a portion of a surface of the crystal body.

SUMMARY

The problem of the present disclosure is to provide a sensor device for magnetic field measurement by means of optical magnetic resonance measurement, which has a reduced size and reduced manufacturing costs compared to known devices.

To solve the underlying problem of the disclosure, a sensor device for magnetic field measurement by means of optical magnetic resonance measurement (ODMR) is proposed, comprising: a diamond having a plurality of color centers, in particular nitrogen defects, a laser emitter, a first photodetector, and a circuit board, wherein the laser emitter is designed for the fluorescence excitation of the color centers in the diamond, and the first photodetector is designed to receive fluorescence radiation of the color centers of the diamond, wherein it is provided that the circuit board has a plurality of layers comprising at least one inner layer; the laser emitter is disposed on an upper face of the circuit board; the first photodetector is disposed on a lower face of the circuit board; the diamond is disposed in the interior of the circuit board in the plane of extension of the at least one inner layer; and at least one of the layers has current-carrying structures which are designed to produce a homogeneous magnetic field which is oriented perpendicularly to the layers of the circuit board and which permeates the diamond.

In the context of the present disclosure, the terms "nitrogen defect," "nitrogen defect center," and "NV center" are used interchangeably and can be exchanged with one another.

Preferably, the color centers, in particular the nitrogen defect centers and/or the NV centers, are negatively charged.

The physical principle of magnetic field measurement by means of optical magnetic resonance measurement (ODMR), for which the sensor device according to the disclosure is suitable, is known to the person skilled in the art and will not be explained in greater detail at this point.

The circuit board of the sensor device according to the disclosure comprises a plurality of layers. That is to say, in particular, the circuit board is formed from a plurality of layers of a substrate, wherein each layer can comprise current-carrying structures. The planes of extension of the layers lie parallel to one another, and the layers are disposed and connected not spaced apart from and in direct physical contact with one another.

The circuit board comprises at least one inner layer. Accordingly, the circuit board comprises at least three layers. The diamond of the sensor device is disposed in the plane of extension of the at least one inner layer. For this purpose, a corresponding recess can be provided in the at least one inner layer. In the direction perpendicular to the plane of extension of the inner layer, the diamond can project beyond the inner layer such that the diamond is also disposed at least partially in further inner layers of the circuit board, if present. Because the diamond is disposed in the interior of the circuit board in the plane of extension of the at least one inner layer, the inner layer encloses the diamond.

According to the present disclosure, it is now provided that at least one of the layers has current-carrying structures designed in order to generate a magnetic field that is perpendicular to the layers of the circuit board and that is homogeneous and penetrates the diamond.

The homogeneous magnetic field, which penetrates the diamond, can be a bias magnetic field, with which, during the magnetic resonance measurement, the contributions of the possible spin orientations of the nitrogen defects in the diamond can be distinguished even without a magnetic field acting on the sensor device from the outside.

Particularly advantageously, with the sensor device according to the disclosure, a particularly compact sensor device for magnetic field measurement can be provided by the arrangement of the diamond in the interior of the circuit board and the current-carrying structures disposed in the interior of the circuit board. Furthermore, manufacturing costs are reduced.

The current-carrying structures can be designed as a coil or as a current loop. That is to say, in an aerial view of the circuit board, the current-carrying structures can be formed circularly or annularly perpendicular to the planes of extension of the layers. Furthermore, it can be provided that the current-carrying structures enclose the diamond disposed in the inner layer.

In known devices, for example, the bias magnetic field is produced with a pair of Helmholtz coils disposed outside of the sensor devices. In the sensor device according to the disclosure, the use of an external pair of Helmholtz coils can be omitted. The production of the bias magnetic field is taken over by the current-carrying structures integrated into the circuit board.

Further advantageously, it can be provided that the laser emitter is a laser diode and/or that the photodetector is a photodiode. Laser diodes can provide the required intensity for optical excitation of the diamond's nitrogen defect centers. Moreover, laser diodes and/or photodiodes are small and inexpensive.

The laser emitter is preferably designed in order to emit green-range optical light of between 520 nm to 530 nm.

Further advantageously, it can be provided that a plurality of the layers have current-carrying structures in order to generate the homogeneous magnetic field, wherein the layers are preferably disposed above and below the layer enclosing the diamond.

In a particular embodiment, above the layer enclosing the diamond, at least one further layer is provided, which comprises a current-carrying structure designed, for example, as a current loop or as a coil. Furthermore, preferably below the layer enclosing the diamond, a further layer is provided, which comprises a current-carrying structure designed, for example, as a current loop or as a coil. Above and below the layer enclosing the diamond, there can also be disposed multiple layers having current-carrying structures.

The terms "above" and "below" refer to a direction perpendicular to the planes of extension of the layers, wherein layers arranged "above" the layers enclosing the diamond are disposed closer to the upper face and the laser emitter disposed on the upper face, and layers "below" the layer enclosing the diamond are disposed closer to the lower face and the photodetector disposed on the lower face.

Preferably, it can be provided that the direction of emission of the laser emitter is oriented parallel to the upper face of the circuit board and that a first optical element is disposed on a first light outlet face of the laser emitter, which is designed in order to deflect laser light exiting the first light outlet face, preferably by 90°, so that the laser light strikes the diamond.

The first optical element is thus designed in order to deflect the laser beam exiting the first light outlet face of the laser emitter, which exits the laser emitter parallel to the upper face of the circuit board, into the interior of the circuit board, preferably by 90°, so that the laser light strikes the diamond disposed there. The laser emitter can therefore be mounted flush and directly on the upper face of the circuit board, thereby saving space.

Preferably, it is contemplated that the first optical element is disposed in immediate and direct physical contact with the first light outlet face of the laser emitter.

Preferably, it is provided that the first optical element is a mirror or a prism.

Further preferably, a second photodetector is provided, wherein the second photodetector is disposed on the lower face of the circuit board, and that a second optical element, preferably a mirror or prism, is arranged on a second light outlet face lying opposite the first light outlet face of the laser emitter and is designed to deflect laser light exiting the second light outlet face, preferably by 90°, so that the laser light strikes the second photodetector.

With the laser light emitted from the second light outlet face and directed onto the second photodetector, a reference laser beam can be constructed and measured with the second photodetector. The reference laser beam serves to correct fluctuations in the laser light power.

In order for the laser light directed by the second optical element from the upper face of the circuit board to reach the second photodetector disposed on the lower face of the circuit board, an aperture or opening penetrating the circuit board from the upper face to the lower face can be provided. If necessary, the opening or aperture can be filled with a light-guiding medium.

Accordingly, in order for the laser light deflected by the first optical element from the upper face of the circuit board to reach the diamond disposed in the interior of the circuit board, an aperture or opening penetrating the circuit board from the upper face to the diamond can be provided. If necessary, the opening or aperture can be filled with a light-guiding medium. In addition, a further aperture or opening extending from the diamond to the lower face can be provided so that the fluorescence radiation from the diamond can reach the first photodetector.

It is preferably contemplated that laser light deflected by the first optical element and/or the second optical element passes through the circuit board in a direction perpendicular to the layers.

Preferably, it can be provided that a first optically transparent body, preferably a glass block, is disposed between the first optical element and the diamond such that light deflected by the first optical element passes through the first optically transparent body and strikes the diamond.

The laser light deflected by the first optical element exits the first optical element and enters the first optically transparent body. Through the optically transparent body, the light then travels up to the diamond in order to visually excite it. For this purpose, the optically transparent body can be disposed in a corresponding aperture or opening located above the diamond in the circuit board.

Particularly preferably, the first optically transparent body is not spaced apart from and is in direct physical contact with the outlet face of the first optical element. Furthermore, the diamond disposed below the first transparent body is preferably not spaced apart from and in direct physical contact with a lower face of the first optically transparent body.

Preferably, the diamond has an optical coating on an upper face, preferably the side facing the first optical transparent body, in particular a red reflector, which ensures that green excitation light is nearly completely transmitted, while red fluorescent light of the color centers is nearly completely reflected at wavelengths greater than approximately 700 nm. Further preferably, the diamond has an optical coating on a lower face, in particular a green reflector, which ensures that red fluorescent light with wavelengths greater than 700 nm is nearly completely transmitted, while green excitation light of the laser emitter is nearly completely reflected.

Further advantageously, it is provided that a second optically transparent body, in particular a glass block, is disposed between the diamond and the first photodetector, and metallic conductor tracks are disposed on an upper face of the second optically transparent body, wherein a layer of the circuit board comprises lines for supplying voltage to the metallic conductor tracks.

Below the diamond, i.e., closer to the lower face of the circuit board, a second optically transparent body can be disposed, which is further preferably disposed on the diamond in direct physical contact and not spaced apart. In other words, at least one of the layers of the circuit board below the layer enclosing the diamond comprises the second optically transparent body. The second optically transparent body has an upper face, that is to say, the diamond-facing side, metallic conductor tracks, or a metallic coating. The tracks can be applied with widths and distances of a few micrometers. The layer of the circuit board, or an adjacent layer comprising the second optically transparent body, further comprises lines for supplying voltage to the metallic conductor tracks of the second optically transparent body. By applying an alternating voltage to the lines of the corresponding layer, the metallic conductor tracks can be supplied with alternating current on the second optically transparent body. Thereby, a microwave magnetic field is produced in the diamond, which is oriented parallel to the upper face of the circuit board. Particularly preferably, a microwave frequency of approximately 2.87 GHz is provided for this purpose.

The second optically transparent body can be formed larger in the plane of extension than the diamond.

Preferably, the second optically transparent body is in direct physical contact with and not spaced apart from the diamond.

Preferably, it is provided that a third optically transparent body is disposed between the second optically transparent body and the first photodetector.

The third optically transparent body is preferably in direct physical contact with the lower face of the second optically transparent body. Furthermore, the third optically transparent body is preferably in direct physical contact with the upper face of the first photodetector.

Fluorescent light exiting the diamond passes through the second optically transparent body and through the third optically transparent body to the first photodetector. Apertures, recesses, or apertures for the first, second, and third optically transparent bodies can be provided within the circuit board.

Particularly preferably, all optical elements, i.e., the laser emitter, the first optical element, the first optically transparent body, the diamond, the second optically transparent body, the third optically transparent body, and the photodetector are in direct physical contact with one another in this order. Thus, an optimal beam guidance of the laser is provided, and the design space for the sensor device is reduced.

Further advantageously, it can be provided that a fourth optically transparent body, preferably a glass block, is disposed between the second optical element and the second photodetector.

The fourth optically transparent body is further preferably in direct physical contact with the outlet face of the second optical element and the upper face of the second photodetector. Preferably, the fourth optically transparent body is disposed in an aperture, recess, or opening that penetrates the circuit board from the upper face to the lower face.

Preferably, it is provided that the circuit board comprises at least 5, preferably at least 7, layers.

It is further preferred that a heat sink and/or mass is disposed on the lower face of the circuit board, and that the heat sink and/or mass is connected to the laser emitter by way of a thermal and/or electrical VIA extending from the lower face to the upper face.

By the electrical or thermal VIA, the electrical power loss of the laser emitter, which can be up to 100 mW, can be dissipated to the lower face of the sensor device or the circuit board and distributed there in the heat sink over a relatively large surface area.

Preferably, the laser emitter, in particular the laser diode, is attached with the cathode side to the upper face of the circuit board, in particular soldered. Further preferably, the anode contact of the laser emitter is connected to the upper face layer of the circuit board via a wire bond.

Further preferably, the cathodes of the first and/or second photodetector are electrically and thermally bonded to the heat sink and/or mass.

Further advantageously, spacers can be provided between the heat sink and the lower face of the circuit board.

The spacers increase the mechanical stability of the construction.

Even more advantageously, at least five layers comprise the current-carrying structures for producing the homogeneous magnetic field.

Particularly preferably, the circuit board has dimensions of 5 mm×5 mm measured in the plane of extension. Moreover, components for a laser emitter driver circuit, for a microwave driver circuit, and for an evaluation circuit of the photodetectors can be integrated on or in the circuit board. Preferably, these components are designed as ASIC components.

Particularly preferably, the sensor device has a box volume of 2 cm×2 cm×0.5 cm.

The disclosure will be explained in greater detail in the following with reference to the accompanying FIGURE.

BRIEF DESCRIPTION OF THE DRAWING

The only FIGURE shows a magnetic field measurement sensor device comprising a laser emitter and a diamond disposed in a circuit board.

DETAILED DESCRIPTION

The FIGURE shows a sensor device 100 for magnetic field measurement by means of optical magnetic resonance measurement. The sensor device 100 comprises a diamond 10 having a plurality of color centers, not shown in greater detail, which in the present case are negatively charged nitrogen defects and/or NV centers. The sensor device 100 further comprises a circuit board 11. A laser emitter 13 is disposed on an upper face 12 of the circuit board 11. The laser emitter 13 is designed as a laser diode 14 and emits green light at a wavelength between 520 nm and 530 nm. The circuit board 11 comprises a plurality of layers 15. The plurality of layers 15 comprises an inner layer 15a. The diamond 10 is disposed in the plane of extension 16 of the inner layer 15a. A first photodetector 18 is disposed on a lower face 17 of the circuit board 11. The laser emitter 13 is disposed on the upper face 12 of the circuit board 11 such that the laser light is emitted parallel to the upper face 12 of the circuit board 11. In order to guide the laser light emitted by the laser emitter 13 onto the diamond 10, an optical element 19 designed as a prism 19a, is disposed on a first light outlet face 32a of the laser emitter 13, which deflects the laser light 90° downward towards the diamond 10 into the circuit board 11. Between the first optical element 19 and the diamond 10, a first optically transparent body 21 is disposed in an opening 20 provided in the circuit board 11. Below the diamond 10, a second optically transparent body 23 and a third optically transparent body 24 are disposed in a further opening 22 of the circuit board 11, wherein the third optically transparent body 24 is disposed below the second optically transparent body 23. Laser light exiting the first light outlet face 32a of the laser emitter 13 passes through the first optical element 19 and the first optically transparent body 21 and strikes the diamond 10, where it excites the nitrogen defects. Red-shifted fluorescent light is subsequently emitted from the diamond 10, which passes through the second optically transparent body 23 and through the third optically transparent body 24 and strikes the first photodetector 18.

The diamond 10 has a red reflector 26 on an upper face 25, which ensures that green excitation light is nearly completely transmitted, while red fluorescent light of the nitrogen defects is nearly completely reflected with wavelengths greater than approximately 700 nm. Furthermore, the diamond 10 has a green reflector 28 on a lower face 27, which ensures that red fluorescent light with wavelengths greater than 700 nm is nearly completely transmitted, while green excitation light of the laser emitter 13 is nearly completely reflected. On the upper face 29 of the second optically transparent body 23, metallic conductor tracks 30 are disposed. In order to supply voltage to the electrical conductor tracks 30, lines 30a are provided on the layer 15b of the circuit board 11 comprising the second optically transparent body 23. By applying an alternating frequency of approximately 2.87 GHz to the lines 30a, a microwave magnetic field can be produced in the diamond 10, which is oriented parallel to the upper face 12 of the circuit board 11. Furthermore, a plurality of the inner layers 15c have current-carrying structures 31 which are designed so as to generate a magnetic field aligned perpendicular to the layers 15 of the circuit board 11, which field is homogeneous and penetrates the diamond 10. The layers 15c bearing the current-carrying structures 31 are disposed above and below the layer 15a enclosing the diamond 10.

On the second light outlet face 32b of the laser emitter 13 opposite the first light outlet face 32a, a second optical element 33 is disposed, which deflects laser light exiting the second light outlet face 32b by 90° downward towards a second photodetector 34 disposed on the lower face 17 of the circuit board 11. A fourth optically transparent body 36 is inserted in a recess 35 of the circuit board 11. The light exiting the second optical element 33 passes through the fourth optically transparent body 36 and is captured by the second photodetector 34. The laser beam detected by the second photodetector 34 serves as a reference beam in order to correct fluctuations in the laser light power. The laser emitter 13 is soldered with the cathode side 37 facing downwards onto the upper face 12 of the circuit board 11. A wire bond 38 connects the anode contact 39 of the laser emitter 13 to the upper layer 15d of the circuit board 11. Below the cathode side 37 of the laser emitter 13, a thermal and electrical VIA 40 is disposed in the circuit board 11, which extends downward to a heat sink and mass 41 disposed on the lower face 17 of the circuit board 11. By way of the VIA 40, the thermal loss line of the laser emitter 13 can be dissipated.

The cathodes of the first photodetector 18 and the second photodetector 34 are electrically and thermally bonded to the heat sink and mass 41. Furthermore, spacers 42 are provided below the circuit board 11, which keep the heat sinks and mass 41 at a distance from one another and increase the mechanical stability of the structure.

The invention claimed is:

1. A sensor device for magnetic field measurement by means of optical magnetic resonance measurement, comprising:
    a diamond having a plurality of color centers in the form of nitrogen defects;
    a laser emitter;
    a first photodetector; and
    a circuit board,
    wherein
    the laser emitter is designed for fluorescence excitation of the plurality of color centers in the diamond,
    the first photodetector is designed to receive fluorescence radiation of the plurality of color centers of the diamond,
    the circuit board has a plurality of layers comprising at least one inner layer,
    the laser emitter is disposed on an upper face of the circuit board, the first photodetector is disposed on a lower face of the circuit board,
    the diamond is disposed in an interior of the circuit board in a plane of extension of the at least one inner layer, and
    at least one of the plurality of layers has current-carrying structures which are designed to produce a homogeneous magnetic field which is oriented perpendicularly to the plurality of layers of the circuit board and which permeates the diamond.

2. The sensor device according to claim 1, wherein the laser emitter is a laser diode, and/or the first photodetector is a photodiode.

3. The sensor device according to claim 1, wherein:
a plurality of the plurality of layers have current-carrying structures for producing the homogeneous magnetic field; and
the plurality of layers are disposed above and below the at least one inner layer enclosing the diamond.

4. The sensor device according to claim 1, wherein;
an emission direction of the laser emitter is aligned parallel with the upper face of the circuit board;
a first optical element is disposed on a first light outlet face of the laser emitter, which is designed to deflect laser light exiting the first light outlet face by 90°, so that the laser light strikes the diamond; and
the first optical element is a mirror or a prism.

5. The sensor device according to claim 4, wherein:
a second photodetector is provided;
the second photodetector is disposed on the lower face of the circuit board; and
a second optical element in the form of a mirror or prism, is arranged on a second light outlet face lying opposite the first light outlet face of the laser emitter and is designed to deflect laser light exiting the second light outlet face by 90°, so that the laser light strikes the second photodetector.

6. The sensor device according to claim 4, wherein a first optically transparent body in the form of a glass block, is disposed between the first optical element and the diamond, so that light deflected by the first optical element passes through the first optically transparent body and strikes the diamond.

7. The sensor device according to claim 6, wherein;
a second optically transparent body is disposed between the diamond and the first photodetector;
metallic conductor tracks are disposed on an upper face of the second optically transparent body; and
a layer of the plurality of layers of the circuit board comprises lines configured to supply voltage to the metallic conductor tracks.

8. The sensor device according to claim 7, wherein a third optically transparent body is disposed between the second optically transparent body and the first photodetector.

9. The sensor device according to claim 5, wherein a fourth optically transparent body in the form of a glass block, is disposed between the second optical element and the second photodetector.

10. The sensor device according to claim 1, wherein:
(i) the plurality of layers comprises at least 5 layers, and/or (ii) a heat sink and/or mass is disposed on the lower face of the circuit board, and the heat sink and/or mass is connected to the laser emitter by a thermal and/or electric via extending from the lower face to the upper face.

11. The sensor device according to claim 10, wherein the plurality of layers comprises at least 7 layers.

* * * * *